United States Patent
Chung

(10) Patent No.: US 9,136,701 B2
(45) Date of Patent: Sep. 15, 2015

(54) HIGH VOLTAGE DISCHARGE PROTECTION DEVICE AND RADIO FREQUENCY TRANSMISSION APPARATUS USING THE SAME

(71) Applicant: CHIT SHUN CATV EQUIPMENT LIMITED, Kwai Chung, N.T. (HK)

(72) Inventor: Siu Shan Chung, Kwai Chung (HK)

(73) Assignee: CHIT SHUN CATV EQUIPMENT LIMITED, Kwai Chung, N.T. (HK)

( * ) Notice: Subject to any disclaimer, the term of this patent is extended or adjusted under 35 U.S.C. 154(b) by 183 days.

(21) Appl. No.: 13/953,760

(22) Filed: Jul. 30, 2013

(65) Prior Publication Data
US 2014/0355163 A1    Dec. 4, 2014

(30) Foreign Application Priority Data
May 28, 2013 (HK) .................................. 13106307

(51) Int. Cl.
| H02H 9/04 | (2006.01) |
| H01T 2/02 | (2006.01) |
| H01T 4/02 | (2006.01) |
| H05K 1/02 | (2006.01) |
| H01G 4/00 | (2006.01) |

(52) U.S. Cl.
CPC .. *H02H 9/04* (2013.01); *H01T 2/02* (2013.01); *H01T 4/02* (2013.01); *H05K 1/026* (2013.01); *H01G 4/00* (2013.01); *H05K 2201/10015* (2013.01); *H05K 2201/10287* (2013.01); *H05K 2201/10651* (2013.01)

(58) Field of Classification Search
CPC .............. H02H 9/04; H01T 2/02; H01T 4/02; H05K 1/026
USPC .......................................................... 361/119
See application file for complete search history.

(56) References Cited

U.S. PATENT DOCUMENTS

| 4,586,104 A * | 4/1986 | Standler ......................... 361/119 |
| 4,626,957 A * | 12/1986 | Kaneko et al. ............. 361/275.1 |
| 7,977,137 B1 | 7/2011 | Ebel et al. |
| 2013/0090010 A1* | 4/2013 | Darrow et al. ........... 439/620.03 |

FOREIGN PATENT DOCUMENTS

| CN | 2612181 Y | 4/2004 |
| CN | 201528202 U | 7/2010 |
| CN | 201110678 U | 5/2012 |

* cited by examiner

*Primary Examiner* — Scott Bauer
(74) *Attorney, Agent, or Firm* — Mark M. Friedman

(57) ABSTRACT

A high voltage discharge protective device for an RF device having a signal port, includes a blocking capacitor arranged at the signal port of the RF device, a circuit board for mounting the blocking capacitor, and a metal conductor grounded and partially bare. The blocking capacitor includes a main body and two leads connected to the main body and secured to the circuit board. The bottom portion of the main body is bare to form an exposed portion. The exposed portion is spaced apart from the circuit board to form an interval. The metal conductor is disposed within the interval and corresponds to the exposed portion of the blocking capacitor. When the passing voltage within the blocking capacitor reaches a predetermined value, the exposed portion of the blocking capacitor sparkly discharges to the metal conductor. An RF device is also provided.

14 Claims, 2 Drawing Sheets

HIGH VOLTAGE DISCHARGE PROTECTION DEVICE AND RADIO FREQUENCY TRANSMISSION APPARATUS USING THE SAME

BACKGROUND

1. Technical Field

The present disclosure relates to RF (Radio Frequency, RF) devices, and more particularly to an RF device having a high voltage discharge protective function/capability.

2. Description of Related Art

In Broadcasting Industry, to protect the signal port of a RF device from undergoing high voltage, a discharge tube, over-current inductor, and on the like, are employed. With the increment of the market competition in RF transmission equipment (CATV) industry, the transmission equipment needs to be predigest, and cost effective. There are a lot of shortcomings to employ the ordinary discharge components or devices for example, high material cost and great dimension resulting in space limitation.

Therefore, there is a perspective for improvement in the art.

SUMMARY

Embodiments of the present invention relate to a high voltage discharge protective device and an RF device.

An embodiment of the high voltage discharge protective device for an RF device having a signal port is provided. The high voltage discharge protective device includes a blocking capacitor arranged at the signal port of the RF device, a circuit board for mounting the blocking capacitor, and a metal conductor grounded and partially bare. The blocking capacitor includes a main body and two leads. Opposite ends of the leads are secured to the main body and the circuit board. The bottom portion of the main body is bare to form an exposed portion. The exposed portion is spaced apart from the circuit board to form an interval. The metal conductor is disposed within the interval and corresponds to the exposed portion of the blocking capacitor. When the passing voltage within the blocking capacitor reaches a predetermined value, the exposed portion of the blocking capacitor sparkly discharges to the metal conductor.

Wherein, the blocking capacitor is substantially sheet shaped, and includes a coating layer, two electrodes, and a dielectric medium. The electrodes are secured to opposite sides of the dielectric medium. Each of the leads of the blocking capacitor is electrically connected to one of the electrodes. The upper portion of the electrodes and the dielectric medium are coated by the coating layer, with the bottom portion of the electrodes and the dielectric medium being exposed.

Wherein, the blocking capacitor is ceramic capacitor, and the dielectric medium is made of ceramic.

Wherein, the metal conductor includes a bare main portion, the main portion corresponds to the exposed portion of the main body of the capacitor.

Wherein, the metal conductor crossovers below the bottom of the main body.

Wherein the distance between the metal conductor and the exposed portion of the main body of the capacitor is less than 2 mm.

An RF device is also provided. The RF device includes a port circuit arranged with in a signal port. The port circuit includes a blocking capacitor and a metal conductor. The blocking capacitor includes a main body and two leads connected to the main body. The main body includes an exposed portion. The exposed portion is spaced apart from the circuit board to form an interval. The metal conductor is grounded and partially bare. The metal conductor corresponds to the exposed portion of the blocking capacitor. When the voltage of the blocking capacitor reaches a predetermined value, the exposed portion of the blocking capacitor sparkly discharges to the metal conductor.

Wherein, the port circuit includes a circuit board. The leads of the blocking capacitor is mounted to the circuit board. The exposed portion is the bottom of the main body. The exposed portion is spaced apart form the circuit board to form an interval, and the metal conductor is disposed within the interval.

Wherein, the blocking capacitor is substantially sheet shaped, and includes a coating layer, two electrodes, and a dielectric medium. The electrodes are secured to opposite sides of the dielectric medium. Each of the leads the blocking capacitor is electrically connected to one of the electrodes. The upper portion of the electrodes and dielectric medium are coated by the coating layer, with the bottom portion of the electrodes and the dielectric medium being exposed.

Wherein, the distance between the metal conductor and the exposed portion of the main body of the capacitor is less than 2 mm.

In the present invention, the main body of the blocking capacitor of the high voltage discharge protective device is bare at the bottom, and the metal conductor is arranged between the exposed portion of the blocking capacitor and the circuit board, thus the high voltage discharge protective device can protect the RF device from undergoing high voltage. Furthermore, the cost of producing the high voltage discharge protective device is low, and the high voltage discharge protective is miniature to make it easy to be mounted to the RF device.

The following detailed description, together with the accompanying drawings will provide a better understanding of the nature and advantages of the present invention.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts through out the several views.

DETAILED DESCRIPTION

The disclosure is illustrated by way of example and not by way of limitation in the figures of the accompanying drawings in which like reference indicate similar elements. It should be noted that reference to "an" or "one" embodiment in the disclosure are not necessarily to the same embodiment, and such references mean "at least one".

Figure 1:
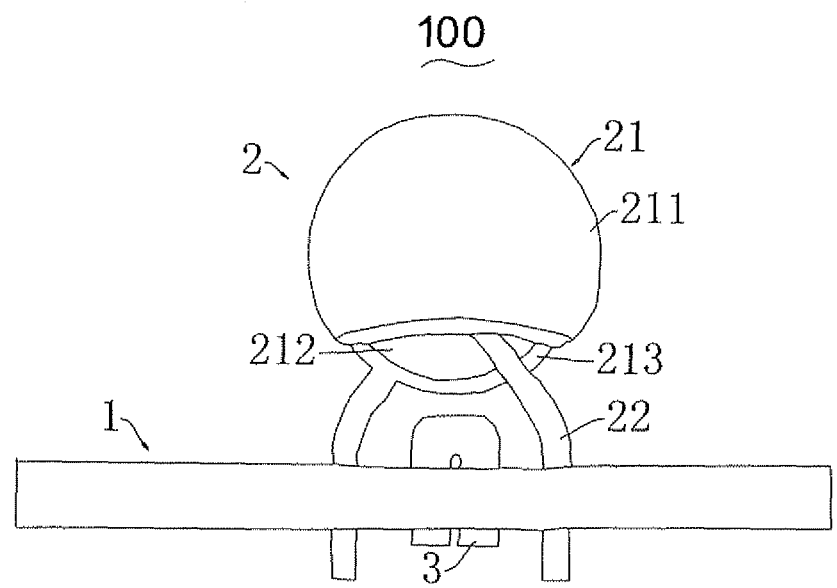
FIG. 1 is a schematic view of a high voltage discharge protective device, in accordance with an exemplary embodiment.

FIG. 1 illustrates an embodiment of a high voltage discharge protective device 100. The high voltage discharge protective device 100 can be employed in an RF device, of the cable television network. The high voltage discharge protective device 100 is arranged at a signal port of the RF device to block DC, couple RF, and protect the RF device from high voltage discharge. The high voltage discharge protective device 100 includes a blocking capacitor 2, a circuit board 1, and a metal conductor 3. The blocking capacitor 2 is fixed to the circuit board 1, and the metal conductor 3 is secured to the circuit board 1 and grounded.

The blocking capacitor 2 includes a main body 21 and two leads 22. The blocking capacitor 2 is secured to the circuit board 1 via the leads 22. The circuit board 1 and the blocking capacitor 2 are both arranged at an input terminal of the signal port of the RF device. A lower portion of the main body 21 is bare to form a exposed portion. An interval is existed between the exposed portion of the main body 21 and the circuit board 1. The metal conductor 3 is disposed within the interval and corresponds to the exposed portion of the main body 21.

Figure 2:
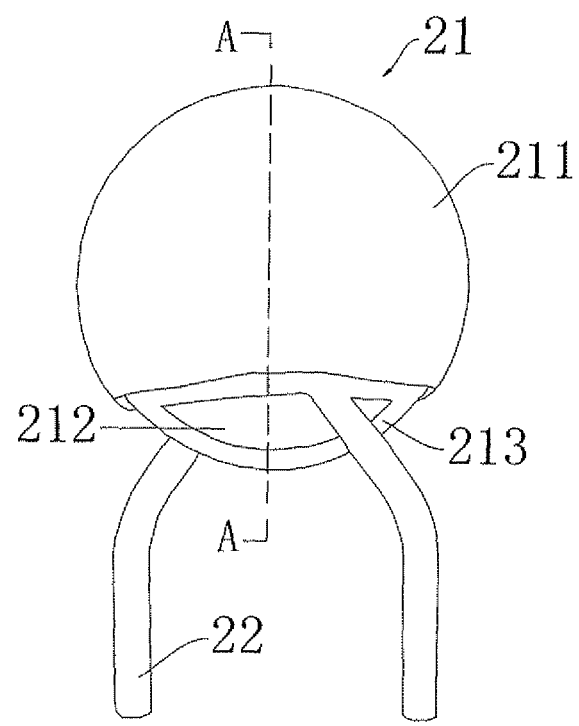
FIG. 2 is a schematic view of a blocking capacitor of the high voltage discharge protective device of FIG. 1.
Figure 3:
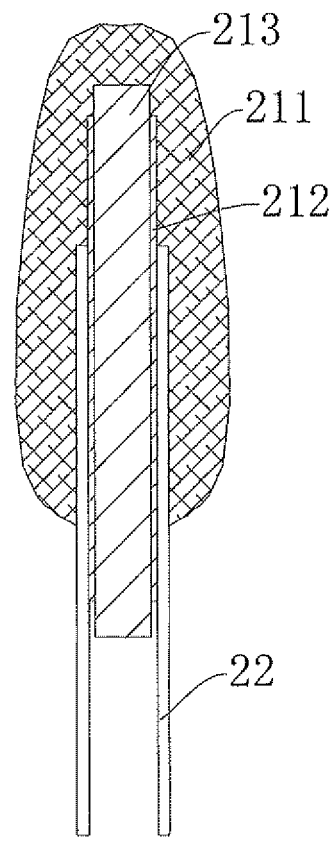
FIG. 3 is a cross-sectional view of the blocking capacitor of FIG. 2, taken along line A-A.

Referring also to FIGS. 2-3, the main body 21 includes a coating layer 211, two electrodes 212, and a dielectric medium 213. Each electrode 212 is secured to one of opposite sides of the dielectric medium 213. A portion of each electrode 212 and a portion of the dielectric medium 213 are coated by the coating layer 211, and the remaining portion of each electrode 212 and the remaining portion of the dielectric medium 213 are bare. The exposed portion of each electrode 212 and the exposed portion of the dielectric medium 213 are arranged at the bottom portion of the main body 21.

In this embodiment, both electrodes 212 are partially bare. It is noteworthy that, as voltage discharge is carried out between two electrodes 212, if only one of the electrodes 212 is partially bare, the discharging voltage also increases.

In this embodiment, the main body 21 is sheet shaped, and the electrodes 212 are also sheet shaped. The dielectric medium 213 is made of, but not limited to, ceramics.

In this embodiment, as the blocking capacitor 2 has a function of high voltage discharge, the blocking capacitor 2 is sheet shaped. In other embodiment, the blocking capacitor 2 can be a SMD capacitor.

Referring again to FIG. 1, the metal conductor 3 is substantially U-shaped, and includes a main portion. Two ends of the main portion are bent toward the same direction to form two bent portions. The metal conductor 3 is secured to the circuit board 1 via the bent portions, and is arranged below the main body 21. In other embodiment, the metal conductor 3 can be designed to other shapes or structure to ensure that the main body 21 of the blocking capacitor 2 can sparkly discharge toward the metal conductor 3.

The main portion of the metal conductor 3 is bare to form a bare surface. The bare surface corresponds to the exposed portion of the main body 21. The main portion of the metal conductor 3 is spaced apart from the exposed portion of the main body 21 to form an interval. In the embodiment, the distance between the main portion of the metal conductor 3 and the exposed portion of the main body 21 is less than 2 mm.

The distance between the main portion of the metal conductor 3 and the exposed portion of the main body 21 is designed to be less than 2 mm, thus the blocking capacitor 2 accumulates overabundance energy can be avoided, and the energy accumulated in the blocking capacitor 2 can be released earlier, thus electronic components of the RF device can be protected from being damaged. During the discharging procedure of the blocking capacitor 2, a part of energy is dispered via the metal conductor 3 as the blocking capacitor 2 can discharge toward the metal conductor 3. Therefore, it is better to short the distance between the main portion of the metal conductor 3 and the exposed portion of the main body 21. By experimental testing, it is concluded that when the distance between the main portion of the metal conductor 3 and the exposed portion of the main body 21 is greater than 2 mm, the voltage is too high to damage the electronic components.

Figure 4:
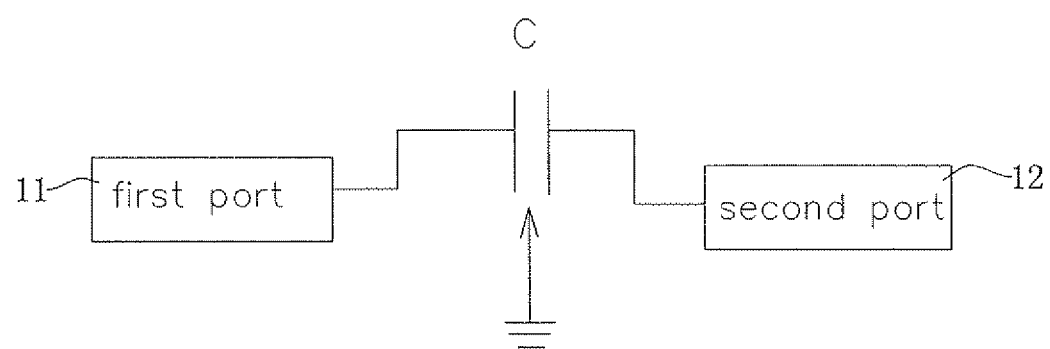
FIG. 4 is a block diagram of the high voltage discharge protective device of FIG. 1, in accordance with an exemplary embodiment.

Referring also to FIG. 4, the RF device includes a first port 11. The blocking capacitor 2 (shown by C in FIG. 4) corresponds to the metal conductor 3 which is grounded, with one of the electrodes 212 thereof being electrically connected to the first port 11. The second port 12 of the external device is electrically connected to the other electrodes 212 of the blocking capacitor 2. When the first port 11 generates high voltage, the blocking capacitor 2 sparkly discharge toward the metal conductor 3 via the exposed portion, and the energy is transferred to the metal conductor 3 to be further grounded, whereby the second port 12 and other electronic components electrically connected to the blocking capacitor 2 is protected from being damaged.

The typical protective device mounted to the input port of the RF device, adapts discharge tube, over-current inductor and on the like to achieve discharge protection, in the present invention, by virtue of the above structure in the embodiment, because the metal conductor 3 is further mounted to the circuit board 1 and is arranged below and corresponding to the exposed portion of the main body 21, the occupied space of the high voltage discharge protective device 100 is unchanged, and the circuit board 1 can be design more better and more compactor, to allow the product to be miniaturized and low cost.

When the passing voltage within the blocking capacitor 2 reaches a predetermined value, the exposed portion thereof sparkly discharge to release energy via the metal conductor 3, whereby the electronic components is protected from being damaged. However, the capacitor of the typical protective device not sparkly discharge until the accumulated energy reaches a high level, which is great than the predetermined value, at this time, the capacitor has been breakdown, and the circuit is damaged and is disfunction.

The structure of the high voltage discharge protective device 100 is simple. The high voltage discharge protective device 100 adapts the metal conductor 3 to disperse the high energy, to achieve high voltage discharge protection. Furthermore, because the structure of the high voltage discharge protective device 100 is small-sized, and the components thereof are cheap, thus, the cost of the product will be down. In additional, because of the components of the high voltage discharge protective device 100 is stable, the high voltage discharge protective device 100 is durable, and the life is long.

Furthermore, the blocking capacitor 2 is capable of isolating DC and coupling RF simultaneously, the principle as follow: as high frequency signal belongs to AC signal, the capacitor occurs low impedance characteristic in respective to AC signal, and the higher the frequency, the lower the impedance. Thus, the impedance of the high frequency signal of the Community Antenna Television (5 MHz-3000 MHz) through the capacitor is negligible. However, the impedance of the blocking capacitor to DC is infinity, and cannot pass through.

In a second embodiment, the RF device includes a port circuit. The port circuit includes a blocking capacitor 2. The blocking capacitor 2 includes main body 21 and two leads 22 fixed to the main body. The main body 21 includes an exposed portion. The port circuit further includes a metal conductor 3. The conductor 3 is grounded. At least a part of the conductor 3 is bare. The metal conductor 3 is spaced apart form and corresponding to the exposed portion of the main body 21. When the voltage of the blocking capacitor 2 reaches a predetermined value, the exposed portion thereof sparkly discharge to release energy by the metal conductor 3, whereby the electronic components is protected from damaged.

In the second embodiment, the blocking capacitor 2 is substantially sheet shaped. The blocking capacitor 2 includes a coating layer 211, two electrodes 212, and a dielectric medium 213. The electrodes 212 are substantially sheet shaped, and are secured to opposite sides of the dielectric medium 213. The leads 22 are electrically connected to the electrodes 212 respectively. The upper portion of the electrodes 212 and dielectric medium 213 are coated by the coating layer 211, with the bottom portion of the electrodes 212 and the dielectric medium 213 being exposed.

In the second embodiment, the distance between the main portion of the metal conductor 3 and the exposed portion of the main body 21 is designed to be less than 2 mm, thus the blocking capacitor 2 accumulates overabundance energy can be avoided, and the energy accumulated in the blocking capacitor 2 can be released earlier, thus electronic components of the RF device can be protected from being damaged. During the discharging procedure of the blocking capacitor 2, a part of energy is dispersed via the metal conductor 3 as the blocking capacitor 2 can discharge toward the metal conductor 3, and the metal conductor 3 functions to disperse energy accumulated in the blocking capacitor 2.

In the second embodiment, by arranging the metal conductor 3 below the blocking capacitor 2 and corresponding to the exposed portion of the main body 21, the product is protected from high voltage or high current, at the same time, the occupied space of the high voltage discharge protective device 100 is unchanged (noted that: a blocking capacitor is arranged at the signal portion of a typical RF device or apparatus), to allow the product to be small-sized and to cut down the cost.

Although information as to, and advantages of, the present embodiments have been set forth in the foregoing description, together with details of the structures and functions of the present embodiments, the disclosure is illustrative only; and changes may be made in detail, especially in the matters of Shae, size, and arrangement of parts within the principles of the present embodiments to the full extent indicated by the broad general meaning of the terms in which the appended claims are expressed.

What is claimed is:

1. A high voltage discharge protective device, for an RF device having a signal port, comprising: a blocking capacitor arranged at the signal port of the RF device and a circuit board for mounting the blocking capacitor, the blocking capacitor comprising a main body and two leads, opposite ends of the leads being respectively secured to the main body and the circuit board, the bottom portion of the main body being bare to form an exposed portion, the exposed portion being spaced apart from the circuit board to form an interval; wherein the device further comprises a metal conductor which is grounded and partially bare; wherein the metal conductor is disposed within the interval and corresponds to the exposed portion of the blocking capacitor; when the passing voltage within the blocking capacitor reaches a predetermined value, the blocking capacitor itself discharges and the exposed portion of the blocking capacitor sparkly discharges to the metal conductor.

2. The high voltage discharge protective device of claim 1, wherein the blocking capacitor is substantially sheet shaped, and includes a coating layer, two electrodes, and a dielectric medium, the electrodes are secured to opposite sides of the dielectric medium, each of the leads are electrically connected to one of the electrodes, the upper portion of the electrodes and dielectric medium are coated by the coating layer, with the bottom portion of the electrodes and the dielectric medium being exposed.

3. The high voltage discharge protective device of claim 2, wherein the blocking capacitor is ceramic capacitor, and the dielectric medium is made of ceramic.

4. The high voltage discharge protective device of claim 3, wherein the metal conductor comprises a bare main portion, the main portion corresponds to the exposed portion of the main body of the capacitor.

5. The high voltage discharge protective device of claim 4, wherein the metal conductor crossovers below the bottom of the main body.

6. The high voltage discharge protective device of claim 1, wherein the distance between the metal conductor and the exposed portion of the main body of the capacitor is less than 2 mm.

7. The high voltage discharge protective device of claim 2, wherein the distance between the metal conductor and the exposed portion of the main body of the capacitor is less than 2 mm.

8. The high voltage discharge protective device of claim 3, wherein the distance between the metal conductor and the exposed portion of the main body of the capacitor is less than 2 mm.

9. The high voltage discharge protective device of claim 4, wherein the distance between the metal conductor and the exposed portion of the main body of the capacitor is less than 2 mm.

10. The high voltage discharge protective device of claim 5, wherein the distance between the metal conductor and the exposed portion of the main body of the capacitor is less than 2 mm.

11. An RF device, comprising a port circuit arranged within a signal port; wherein the port circuit comprises a blocking capacitor and a metal conductor; the blocking capacitor comprises a main body and two leads connected to the main body, the main body comprises an exposed portion; the metal conductor is grounded and partially bare; the metal conductor corresponds to the exposed portion of the blocking capacitor; when the passing voltage within the blocking capacitor reaches a predetermined value, the blocking capacitor itself discharges and the exposed portion of the blocking capacitor sparkly discharges to the metal conductor.

12. The RF device of claim 11, wherein the port circuit comprises a circuit board, the leads are mounted to the circuit board, the exposed portion is arranged at the bottom of the main body, the exposed portion is spaced apart from the circuit board to form an interval, the metal conductor is disposed within the interval.

13. The RF device of claim 12, wherein the blocking capacitor is substantially sheet shaped, and includes a coating layer, two electrodes, and a dielectric medium, the electrodes are secured to opposite sides of the dielectric medium, each of the leads are electrically connected to one of the electrodes, the upper portion of the electrodes and dielectric medium are coated by the coating layer, with the bottom portion of the electrodes and the dielectric medium being exposed.

14. The RF device of claim 13, wherein the distance between the metal conductor and the exposed portion of the main body of the capacitor is less than 2 mm.

* * * * *